(12) United States Patent
Yen et al.

(10) Patent No.: US 11,955,518 B2
(45) Date of Patent: Apr. 9, 2024

(54) EPITAXIAL STRUCTURE AND TRANSISTOR INCLUDING THE SAME

(71) Applicant: XIAMEN SANAN INTEGRATED CIRCUIT CO., LTD., Xiamen (CN)

(72) Inventors: Chih-Hung Yen, Xiamen (CN); Wenbi Cai, Xiamen (CN); Houng-Chi Wei, Xiamen (CN)

(73) Assignee: Xiamen Sanan Integrated Circuit Co., Ltd., Xiamen (CN)

( * ) Notice: Subject to any disclaimer, the term of this patent is extended or adjusted under 35 U.S.C. 154(b) by 458 days.

(21) Appl. No.: 17/233,772

(22) Filed: Apr. 19, 2021

(65) Prior Publication Data

US 2021/0242311 A1  Aug. 5, 2021

Related U.S. Application Data

(63) Continuation-in-part of application No. PCT/CN2020/117262, filed on Sep. 24, 2020.

(30) Foreign Application Priority Data

Sep. 30, 2019 (CN) .......................... 201910937902.0

(51) Int. Cl.
| | |
|---|---|
| *H01L 29/10* | (2006.01) |
| *H01L 21/02* | (2006.01) |
| *H01L 29/08* | (2006.01) |
| *H01L 29/20* | (2006.01) |
| *H01L 29/205* | (2006.01) |

(Continued)

(52) U.S. Cl.
CPC ...... *H01L 29/1004* (2013.01); *H01L 21/0254* (2013.01); *H01L 21/02543* (2013.01); *H01L 21/02546* (2013.01); *H01L 29/0817* (2013.01); *H01L 29/2003* (2013.01);
(Continued)

(58) Field of Classification Search
CPC ............. H01L 29/1004; H01L 29/0817; H01L 29/2003; H01L 29/205; H01L 29/66318; H01L 29/7371; H01L 29/0826; H01L 29/20; H01L 21/0254; H01L 21/02543
See application file for complete search history.

(56) References Cited

U.S. PATENT DOCUMENTS 9,466,669 B2  10/2016  Rodder et al.

FOREIGN PATENT DOCUMENTS

| CN | 103137676 A | 6/2013 |
|---|---|---|
| CN | 103794644 A | 5/2014 |
| CN | 110649088 A | 1/2020 |

OTHER PUBLICATIONS

Chinese Search Report Application No. PCT/CN2020/117262 dated Sep. 24, 2020.

*Primary Examiner* — David A Zarneke
(74) *Attorney, Agent, or Firm* — Thomas | Horstemeyer, LLP

(57) ABSTRACT

An epitaxial structure includes a composite base unit and an emitter unit. The composite base unit includes a first base layer and a second base layer formed on the first base layer. The first base layer is made of a material of $In_xGa_{(1-x)}As_{(1-y)}N_y$, in which $0<x\leq0.2$, and $0\leq y\leq0.035$, and when y is not 0, x=3y. The second base layer is made of a material $In_mGa_{(1-m)}As$, in which $0.03\leq m\leq0.2$. The emitter unit is formed on the second base layer 12 opposite to the first base layer 11, and is made of an indium gallium phosphide-based material. A transistor including the epitaxial structure is also disclosed.

20 Claims, 3 Drawing Sheets

(51) Int. Cl.
*H01L 29/66* (2006.01)
*H01L 29/737* (2006.01)

(52) U.S. Cl.
CPC ...... *H01L 29/205* (2013.01); *H01L 29/66318* (2013.01); *H01L 29/7371* (2013.01)

EPITAXIAL STRUCTURE AND TRANSISTOR INCLUDING THE SAME

CROSS-REFERENCE TO RELATED APPLICATIONS

This application is a bypass continuation-in-part (CIP) application of PCT International Application No. PCT/CN2020/117262, filed on Sep. 24, 2020, which claims priority of Chinese Invention Patent Application No. 201910937902.0, filed on Sep. 30, 2019. The entire content of each of the International and Chinese patent applications is incorporated herein by reference.

FIELD

This disclosure relates to a semiconductor component and a semiconductor device including the same, and more particularly to an epitaxial structure and a transistor including the same.

BACKGROUND

A conventional heterojunction bipolar transistor (HBT) made of indium gallium phosphide (InGaP)-based material has a high reliability, and thus is promising for a wide range of applications. However, such HBT generally has a relatively high turn-on voltage due to formation of a conduction band spike at an emitter-base junction thereof, which might increase power consumption and limit application of the HBT in devices with low turn-on voltage (such as portable mobile devices). In addition, it is important for high-frequency application devices to reduce a power-added efficiency (PAE), an indicator for rating the efficiency of a power amplifier. Therefore, there is still a need to develop a HBT having a low turn-on voltage, so as to reduce power consumption thereof.

SUMMARY

Therefore, an object of the disclosure is to provide an epitaxial structure and a transistor that can alleviate or eliminate at least one of the drawbacks of the prior art.

The epitaxial structure includes a composite base unit and an emitter unit. The composite base unit includes a first base layer and a second base layer formed on the first base layer. The first base layer is made of a material of $In_xGa_{(1-x)}As_{(1-y)}N_y$, in which $0<x\leq0.2$, and $0\leq y<0.035$, and when y is not 0, x=3y. The second base layer is made of a material of $In_mGa_{(1-m)}As$, in which $0.03\leq m\leq 2$. The emitter unit is formed on the second base layer opposite to the first base layer, and is made of an gallium indium phosphide (GaInP)-based material.

The transistor includes the abovementioned epitaxial structure.

BRIEF DESCRIPTION OF THE DRAWINGS

Other features and advantages of the disclosure will become apparent in the following detailed description of the embodiments with reference to the accompanying drawings, in which.

DETAILED DESCRIPTION

Figure 1:
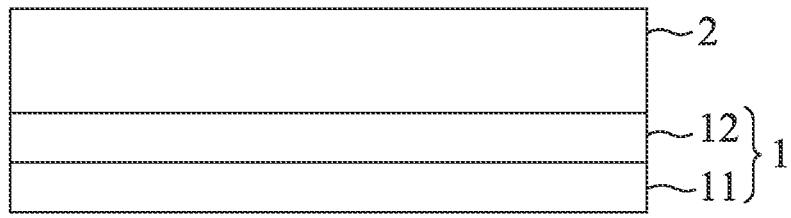
FIG. 1 is a schematic view illustrating a first embodiment of an epitaxial structure according to the disclosure.

Before the disclosure is described in greater detail, it should be noted that where considered appropriate, reference numerals have been repeated among the figures to indicate corresponding or analogous elements, which may optionally have similar characteristics.

Referring to FIG. 1, a first embodiment of an epitaxial structure 100 according to this disclosure includes a composite base unit 1 and an emitter unit 2.

The composite base unit 1 includes a first base layer 11 that is made of a material of $In_xGa_{(1-x)}As_{(1-y)}N_y$, in which $0<x\leq0.2$, and $0\leq y\leq 0.035$. Since the material of the first base layer 11 (i.e., $In_xGa_{(1-x)}As_{(1-y)}N_y$) has a relatively low energy band gap, a conduction band spike at an emitter-base junction between the composite base unit 1 and the emitter unit 2 can be reduced, thereby reducing a turn-on voltage of a transistor to be made using the epitaxial structure 100 (see FIG. 3), e.g., a heterojunction bipolar transistor (HBT).

In certain embodiments, the first base layer 11 is made of $In_xGa_{(1-x)}As_{(1-y)}N_y$ (i.e., y is not equal to 0), and x may be equal to 3y. In such case, y may range from 0.001 to 0.02 (i.e., $0.001\leq y\leq 0.02$), and x may range from 0.003 to 0.06. For example, when y is 0.01 and x is 0.03, the first base layer 11 is made of $In_{0.03}Ga_{0.97}As_{0.99}N_{0.01}$. It is noted that the InGaAsN-based material may have a relatively low carrier mobility, which might increase a resistance of the composite base unit 1, thereby limiting the frequency properties of the transistor to be made. Therefore, the first base layer 11 may be alternatively made of $In_xG_{(1-x)}As$ (i.e., y is equal to 0). When x (the mole fraction of In) gradually increases in $In_xGa_{(1-x)}As$ of the first base layer 11, the band gap (Eg) thereof becomes smaller and the turn-on voltage of the transistor to be made can be reduced. In addition, increasing the mole fraction of In can also improve the carrier mobility so as to facilitate operation of the transistor under high frequency.

On the other hand, increasing the mole fraction of In may inevitably increase the lattice content, which may affect the lattice match between the composite base unit 1 and the emitter unit 2, and decrease the stability and reliability of the transistor to be made for long-term operation. In addition, the critical thickness of $In_xGa_{(1-x)}As$ may decrease as the mole fraction of In increases, which may also increase a resistance of the composite base unit 1, thereby limiting the frequency properties of the transistor to be made. Considering the above factors, in the material of $In_xGa_{(1-x)}As$, x may be set within a range of 0.05 to 0.2. For example, the composite base unit 1 may be made of $In_{0.05}Ga_{0.85}As$, $In_{0.07}Ga_{0.93}As$, $In_{0.1}Ga_{0.9}As$, $In_{0.12}Ga_{0.88}As$, $In_{0.15}Ga_{0.85}As$, $In_{0.2}Ga_{0.8}As$, etc., with characterizations as shown in Table 1.

TABLE 1

| Mole fraction of In | Material | Critical thickness (nm) | Energy band gap (Eg) (eV) | Lattice constant (Å) |
|---|---|---|---|---|
| 0.05 | $In_{0.05}Ga_{0.95}As$ | 72.47 | 1.35104 | 5.67363 |
| 0.07 | $In_{0.07}Ga_{0.93}As$ | 47.62 | 1.32207 | 5.68173 |
| 0.1 | $In_{0.1}Ga_{0.9}As$ | 30.2 | 1.27926 | 5.69388 |
| 0.12 | $In_{0.12}Ga_{0.88}As$ | 23.8 | 1.25116 | 5.70198 |
| 0.15 | $In_{0.15}Ga_{0.85}As$ | 17.7 | 1.20966 | 5.71413 |
| 0.2 | $In_{0.2}Ga_{0.8}As$ | 11.95 | 1.14224 | 5.73438 |

The composite base unit 1 may further include a second base layer 12 that is formed on the first base layer 11. The second base layer 12 is made of a material of $In_mGa_{(1-m)}As$, in which $0.03 \leq m \leq 0.2$. In certain embodiments, when y is equal to 0, the first and second base layers 11, 12 are made of InGaAs materials, in which $0.07 \leq m \leq 0.12$, and $0.07 \leq x \leq 0.12$. For simplicity of manufacture, x may be identical to m. That is, the first and second base layers 11, 12 are made of an identical material. Alternatively, x may be different from m. In certain embodiments, x is smaller than m. For example, x is 0.07 and m is 0.12, i.e., the first base layer 11 is made of $In_{0.07}Ga_{0.93}As$, and the second base layer 12 is made of $In_{0.12}Ga_{0.88}As$. In certain embodiments, the composite base unit 1 may include a plurality of the first base layers 11 and a plurality of the second base layers 12 which are sequentially or alternately stacked on one another.

The composite base unit 1 may have a thickness ranging from 12 nm to 50 nm. Suitable thickness of each of the first and second base layers 11, 12 may depend on the material for making the same and the mole fraction of In contained therein. For example, the first base layer 11 may have a thickness ranging from 0.1 nm to 30 nm. The second base layer 12 may have a thickness ranging from 0.1 nm to 30 nm. The thickness of the first base layer 11 may be identical to that of the second base layer 12. Alternatively, the thickness of the first base layer 11 may be greater or less than that of the second base layer 12.

In certain embodiments, the mole fraction of In in either the first base layer 11 or the second base layer 12 may be fixed or not fixed. When both of the first and second base layers 11, 12 have fixed mole fractions of In, the mole fraction of In in the first base layer 11 is lower than that in the second base layer 12.

In this embodiment, the mole fraction of In in the first base layer 11 is fixed, and the mole fraction of In in the second base layer 12 gradually increases in a direction away from the first base layer 11. That is, x is consistent (e.g., x=0.03) in the first base layer 11, and m gradually increases (e.g., from 0.03) in a direction away from the first base layer 11. In such case, the mole fraction of In in the first base layer 11 is lower than an average mole fraction of In in the second base layer 12.

It should be noted that a gradual increase of indium amount in the second base layer 12 is not particularly limited, and may be adjusted according to practical requirements as long as indium amount increases as a distance from the first base layer 11 increases. For example, a gradual increase of indium amount in the second base layer 12 may be linearly or nonlinearly proportional to a distance from the first base layer 11. In certain embodiments, the second base layer 12 includes a first region and a second region that are respectively located proximal to and distal from the first base layer 12, and that respectively contain $In_zGa_{(1-z)}As$ and $In_wGa_{(1-w)}As$, where $0.9z \leq x \leq 1.1z$, $z<w$ and $x<w$. Each of the first and second regions of the second base layer 12 may have a thickness that is about 5% of the thickness of the second base layer 12. By forming the second base layer 12 on the first base layer 11 with a gradual increase of indium amount, a carrier mobility (e.g., electron mobility) can be further increased, and a resistance of the second base layer 12 can be reduced, thereby improving the frequency properties of the transistor to be made. In addition, as the indium amount gradually increases in the second base layer 12, the conduction band spike between the second base layer 12 and the emitter unit 2 can be reduced, which may further reduce a turn-on voltage of the transistor to be made.

The emitter unit 2 is formed on the second base layer 12 opposite to the first base layer 11. The emitter unit 2 may be made of a gallium indium phosphide (GaInP)-based material. In certain embodiments, the GaInP-based material is $Ga_\beta In_{(1-\beta)}P$, where β ranges from 0.3 to 0.7. In this embodiment, the emitter unit 2 has a single layer structure, β ranges from 0.48 to 0.52 and an indium amount is consistent in the emitter unit 2. The emitter unit 2 may have a thickness ranging from 30 nm to 50 nm.

By disposing the emitter unit 2 made of GaInP-based material on the composite base unit 1, the lattice stress caused by lattice mismatch between the composite base unit 1 and the emitter unit 2 can be effectively reduced, so as to improve the stability and reliability of the transistor to be made.

Figure 2:
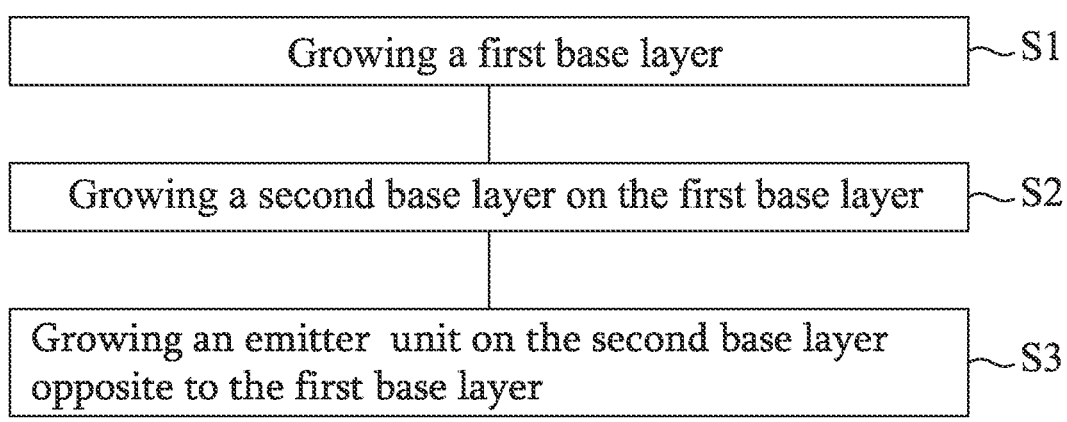
FIG. 2 is a flow chart illustrating consecutive steps of a method for manufacturing the first embodiment of the epitaxial structure.

Referring to FIG. 2, a method for manufacturing the first embodiment of the epitaxial structure 100 includes the following steps S1 to S3.

In step S1, the first base layer 11 is grown with predetermined mole fractions of indium, gallium, arsenic and nitrogen, such that the indium amount is consistent in the first base layer 11, i.e., indium is evenly distributed therein.

In step S2, the second base layer 12 is grown on the first base layer 11 by supplying arsenic and adjusting the mole fractions of indium and gallium, such that the mole fraction of indium in the second base layer 12 gradually increases in a direction away from the first base layer 11 (such as increases from 0.03 to 0.2, e.g. from 0.05 to 0.15). The first and second base layers 11, 12 cooperatively form the composite base unit 1.

In step S3, the emitter unit 2 is formed on the second base layer 12 opposite to the first base layer 11 by supplying phosphorus and a predetermined mole fractions of indium and gallium. The mole fraction of indium in the emitter unit 2 may be set to range from 0.3 to 0.7.

By controlling and adjusting the mole fraction of each of the elements (e.g., indium, gallium, arsenic, and nitrogen) in the materials for making the composite base unit 1 and the emitter unit 2, the method of this disclosure simplifies the manufacturing process of the epitaxial structure 100 without additional steps, such that the thus made epitaxial structure 100 is suitable for making a transistor having a reduced turn-on voltage and a low power consumption, and the manufacturing cost thereof can also be reduced.

Figure 3:
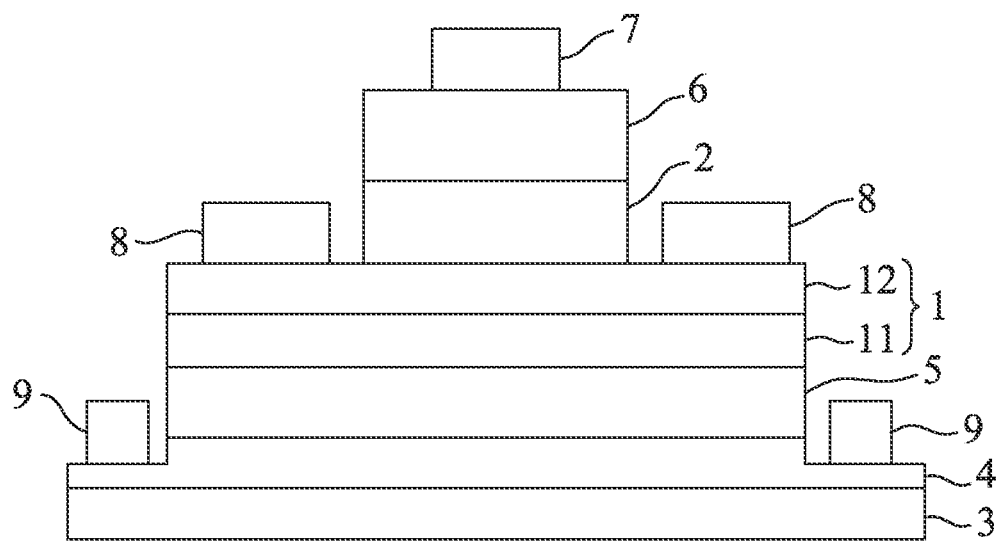
FIG. 3 is a schematic view illustrating a heterojunction bipolar transistor (HBT) including the first embodiment of the epitaxial structure.

Referring to FIG. 3, a heterojunction bipolar transistor (HBT) includes a substrate 3, and a sub-collector layer 4, a collector layer 5, the abovementioned first embodiment of the epitaxial structure 100 (including the composite base unit 1 and the emitter unit 2), and a cap layer 6 that are sequentially disposed on the substrate 3 in such order. The substrate 3, the collector layer 5, and the cap layer 6 may be made of gallium arsenide (GaAs)-based materials. The sub-collector layer 4 may be made of GaAs-based and/or gallium indium phosphide (GaInP)-based materials.

In addition, the HBT may further include an emitter metallic contact layer 7, a base metallic contact layer 8, and a collector metallic contact layer 9. The emitter metallic contact layer 7 is disposed on the cap layer 6 opposite to the emitter unit 2, and forms an ohmic contact with the cap layer 6. The base metallic contact layer 8 is disposed on the composite base unit 1 opposite to the collector layer 5, and forms an ohmic contact with the composite base unit 1. The collector metallic contact layer 9 is disposed on the sub-collector layer 4 opposite to the substrate 3, and forms an ohmic contact with the sub-collector layer 4.

Figure 4:
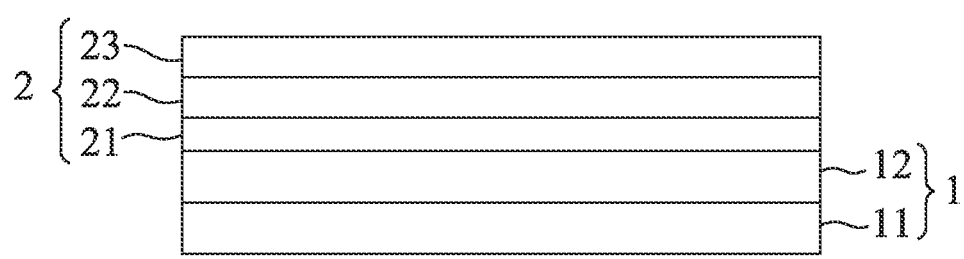
FIG. 4 is a schematic view illustrating a second embodiment of the epitaxial structure according to the disclosure.

Referring to FIG. 4, a second embodiment of the epitaxial structure 100 according to the disclosure is similar to the first embodiment except that, in the second embodiment, the emitter unit 2 has a multi-layered structure, e.g., a first emitter layer 21, a second emitter layer 22, and a third emitter layer 23 being sequentially formed on the second base layer 12 of the composite base unit 1 in such order. The first, second, and third emitter layers 21, 22, 23 are made of GaInP-based materials. The gallium may be present in each of the first, second and third emitter layers 21, 22, 23 in a mole fraction ranging from 0.27 to 0.8, e.g., 0.3 to 0.7.

In this embodiment, the mole fraction of gallium in the first emitter layer 21 gradually decreases in a direction away from the composite base unit 1. The mole fraction of gallium in the second emitter layer 22 is constant. The mole fraction of gallium in the third emitter layer 23 gradually increases in a direction away from the composite base unit 1. It should be noted that a gradual change of the mole fraction of gallium for each of the first and third emitter layers 21, 23 is not particularly limited, and can be adjusted according to practical requirements. For example, a gradual decrease of the mole fraction of gallium in the first emitter layer 21 may be linearly or nonlinearly proportional to a distance from the composite base unit 1. The gradual increase of the mole fraction of gallium in the third emitter layer 23 may also be linearly or nonlinearly proportional to a distance from the second emitter layer 22.

For example, the first emitter layer 21 may include a first region and a second region that are respectively located proximal to and distal from the composite base unit 1, and that respectively contain $Ga_\gamma In_{(1-\gamma)}P$ and $Ga_\delta In_{(1-\delta)}P$, where $\gamma$ ranges from 0.6 to 0.8, and $\delta$ ranges from 0.27 to 0.33. The first and second regions of the first emitter layer 21 may each have a thickness that is about 5% of the thickness of the first emitter layer 21. The second emitter layer 22 may be made of $Ga_\epsilon In_{(1-\epsilon)}P$, where $\epsilon$ ranges from 0.27 to 0.33. The third emitter layer 23 may include a first region and a second region that are respectively located proximal to and distal from said second emitter layer (22), and that respectively contain $Ga_\eta In_{(1-\eta)}P$ and $Ga_\theta In_{(1-\theta)}P$, where $\eta$ ranges from 0.27 to 0.33, and $\gamma$ ranges from 0.46 to 0.56. The first and second regions of the third emitter layer 23 may each have a thickness that is about 5% of the thickness of the third emitter layer 23. In certain embodiments, in the emitter unit 2, $\gamma > \theta > \delta = \epsilon = \eta$. For example, $\gamma = 0.7$, $\theta = 0.51$ and $\delta = \epsilon = \eta = 0.3$.

In certain embodiments, the first emitter layer 21 has a thickness ranging from 1 nm to 5 nm, the second emitter layer 22 has a thickness ranging from 15 nm to 25 nm, and the third emitter layer 23 has a thickness ranging from 5 nm to 10 nm. The emitter unit 2 may have a total thickness ranging from 21 nm to 40 nm.

Figure 5:
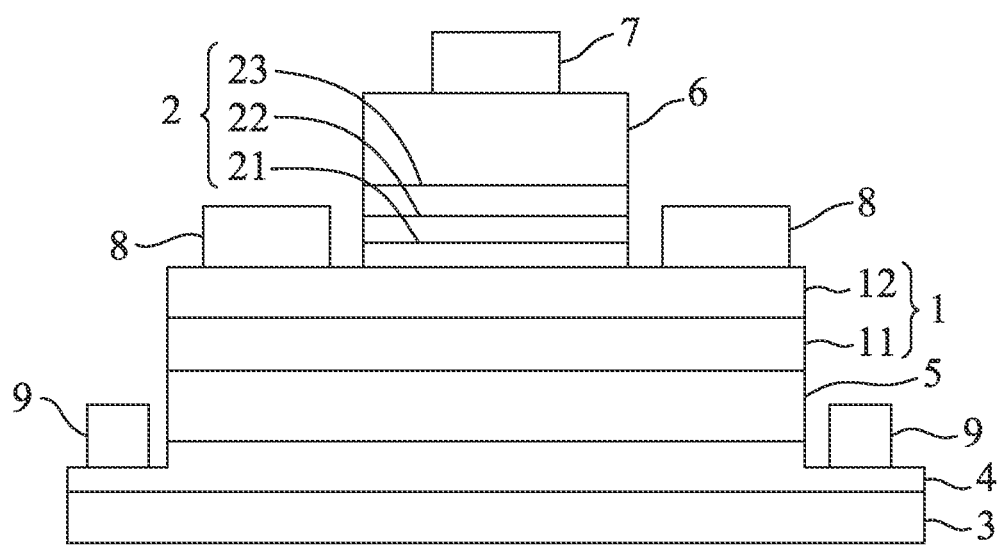
FIG. 5 is a schematic view illustrating a HBT including the second embodiment of the epitaxial structure.

Referring to FIG. 5, a HBT similar to that in FIG. 4 is shown, except that, in this figure, the HBT includes the second embodiment of the epitaxial structure 100, i.e., the emitter unit 2 including the first emitter layer 21, the second emitter layer 22, and the third emitter layer 23 as described above. By forming the emitter unit 2 with multiple emitter layers, the lattice strain can be effective released, so as to improve the reliability of the transistor.

It should be noted that, the number of the base layers in the composite base unit 1 and the number of the emitter layers in the emitter unit 2 are not limited to those disclosed above, and can be modified based on practical requirements. For example, the composite base unit 1 may include more than two base layers, and/or the emitter unit 2 may include two or more than three emitter layers. In addition, the epitaxial structure 100 of the disclosure is not limited to be used in a transistor, and may be used in other electronic devices such as a power amplifier.

In sum, by formation of the composite base unit 1 with materials having relatively small energy band gaps (e.g., InGaAsN-based materials and InGaAs-based materials), the epitaxial structure 100 of this disclosure can be used to make a transistor that exhibits a reduced turn-on voltage. In addition, by maintaining the indium amount in the first base layer 11 and increasing the indium amount in the second base layer 12 in a direction away from the first base layer 11, the carrier mobility in the composite base unit 1 may be increased, and the conduction band spike formed at the emitter-base junction between the composite base unit 1 and the emitter unit 2 may be reduced, which may further reduce the turn-on voltage of the transistor.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. An epitaxial structure, comprising:
   a composite base unit including
      a first base layer made of a material $In_xGa_{(1-x)}As_{(1-y)}N_y$, wherein $0 < x \leq 0.2$, and $0 \leq y \leq 0.035$, and when y is not 0, x=3y, and
      a second base layer formed on said first base layer, and made of a material of $In_mGa_{(1-m)}As$, wherein $0.03 \leq m \leq 0.2$; and
   an emitter unit formed on said second base layer opposite to said first base layer, and made of an gallium indium phosphide (GaInP)-based material.

2. The epitaxial structure according to claim 1, wherein $0.001 \leq y \leq 0.02$.

3. The epitaxial structure according to claim 1, wherein y is equal to 0, and $0.07 \leq m \leq 0.12$ and $0.07 \leq x \leq 0.12$.

4. The epitaxial structure according to claim 1, wherein said composite base unit has a thickness ranging from 12 nm to 50 nm.

5. The epitaxial structure according to claim 4, wherein said first base layer has a thickness ranging from 0.1 nm to 30 nm.

6. The epitaxial structure according to claim 4, wherein said second base layer has a thickness ranging from 0.1 nm to 30 nm.

7. The epitaxial structure according to claim 1, wherein x is consistent in said first base layer, and m gradually increases in a direction away from said first base layer.

8. The epitaxial structure according to claim 7, wherein said second base layer includes a first region and a second region that are respectively located proximal to and distal from said first base layer, and that respectively contain $In_zGa_{(1-z)}As$ and $In_wGa_{(1-w)}As$, where $0.9z \leq x \leq 1.1z$, $z<w$ and $x<w$.

9. The epitaxial structure according to claim 1, wherein said GaInP-based material of said emitter unit is $Ga_\beta In_{(1-\beta)}P$, where $0.3 \leq \beta \leq 0.7$.

10. The epitaxial structure according to claim 9, wherein said emitter unit has a thickness ranging from 30 nm to 50 nm.

11. The epitaxial structure according to claim 1, wherein said emitter unit includes a first emitter layer, a second emitter layer, and a third emitter layer that are sequentially formed on said second base layer of said composite base unit in such order, and that are made of GaInP-based materials, where gallium is present in each of said first, second and third emitter layers in a mole fraction ranging from 0.27 to 0.8.

12. The epitaxial structure according to claim 11, wherein the mole fraction of gallium in each of said first, second and third emitter layers ranges from 0.3 to 0.7.

13. The epitaxial structure according to claim 11, wherein the mole fraction of gallium in said first emitter layer gradually decreases in a direction away from said composite base unit, the mole fraction of gallium in said second emitter layer is consistent, and the mole fraction of gallium in said third emitter layer gradually increases in a direction away from said composite base unit.

14. The epitaxial structure according to claim 13, wherein:
said first emitter layer includes a first region and a second region that are respectively located proximal to and distal from said composite base unit, and that respectively contain $Ga_\gamma In_{(1-\gamma)}P$ and $Ga_\delta In_{(1-\delta)}P$, where $\gamma$ ranges from 0.6 to 0.8, and $\delta$ ranges from 0.27 to 0.33;
said second emitter layer is made of $Ga_\varepsilon In_{(1-\varepsilon)}P$, where $\varepsilon$ ranges from 0.27 to 0.33; and
said third emitter layer includes a first region and a second region that are respectively located proximal to and distal from said second emitter layer, and that respectively contain $Ga_\eta In_{(1-\eta)}P$ and $Ga_\theta In_{(1-\theta)}P$, where $\eta$ ranges from 0.27 to 0.33, and $\gamma$ ranges from 0.46 to 0.56.

15. The epitaxial structure according to claim 14, wherein $\gamma>\theta>\delta=\varepsilon=\eta$.

16. The epitaxial structure according to claim 14, wherein $\gamma$ is 0.7, each of $\delta$, $\varepsilon$ and $\eta$ is 0.3, and $\theta$ is 0.51.

17. The epitaxial structure according to claim 14, wherein said emitter unit has a thickness ranging from 21 nm to 40 nm.

18. The epitaxial structure according to claim 17, wherein said first emitter layer has a thickness ranging from 1 nm to 5 nm, said second emitter layer has a thickness ranging from 15 nm to 25 nm, and said third emitter layer has a thickness ranging from 5 nm to 10 nm.

19. A transistor comprising an epitaxial structure as claimed in claim 1.

20. A transistor comprising an epitaxial structure as claimed in claim 11.

* * * * *